United States Patent [19]
Wolf

[11] Patent Number: 6,154,869
[45] Date of Patent: Nov. 28, 2000

[54] COMBINED ERROR POSITION CIRCUIT AND CHIEN SEARCH CIRCUIT FOR REED-SOLOMON DECODING

[75] Inventor: Tod D. Wolf, Richardson, Tex.

[73] Assignee: Texas Instruments Incorporated, Dallas, Tex.

[21] Appl. No.: 09/200,488

[22] Filed: Nov. 25, 1998

Related U.S. Application Data

[60] Provisional application No. 60/073,474, Feb. 3, 1998.

[51] Int. Cl.$^7$ .................................................. H03M 13/00
[52] U.S. Cl. .............................. 714/784; 714/785; 341/94
[58] Field of Search .................................... 714/752, 756, 714/784, 785, 759, 781; 341/94

[56] References Cited

U.S. PATENT DOCUMENTS

| | | | |
|---|---|---|---|
| 4,649,541 | 3/1987 | Lahmeyer | 714/784 |
| 4,841,300 | 6/1989 | Yoshida et al. | 341/94 |
| 5,517,509 | 5/1996 | Yoneda | 714/785 |
| 5,771,244 | 6/1998 | Reed et al. | 714/752 |
| 5,910,960 | 6/1999 | Claydon et al. | 714/784 |
| 5,951,677 | 9/1999 | Wolf et al. | 712/228 |
| 6,061,826 | 6/2000 | Thirumoorthy et al. | 714/784 |

OTHER PUBLICATIONS

"Polynomial Codes Over Certain Finite Fields," Reed & Solomon, *Journal of the Society For Industrial and Applied Mathematics*, vol. 8 (SIAM, Jun. 1960,), No. 2, pp. 300–304.

*Primary Examiner*—Emmanuel L. Moise
*Attorney, Agent, or Firm*—J. Dennis Moore; Wade James Brady, III; Frederick J. Telecky, Jr.

[57] ABSTRACT

A combined Chien search and error position circuit (116), for use in Reed-Solomon decoding, is disclosed. The circuit (116) operates in response to a zero signal (ZRO) issued by a root detection block (200) that iteratively evaluates an error locator polynomial Λ(x) over the Galois field used in the coding. A zeroes register (218) and a position register (22) are provided, each of which have a plurality of stages (218$_0$ through 218$_t$; 220$_0$ through 220$_t$). An index counter (208) maintains a count over the Galois field, corresponding to the Galois field element under evaluation in the root detection block (200). An exponentiation circuit (212) performs a Galois field exponentiation of the count, and applies the result to the inputs of each of the zeroes register stages (218$_0$ through 218$_t$); the count is subtracted from the maximum Galois field index (e.g., from 255 for Galois field 256) and, for all but the zeroth iteration, the difference is applied to the inputs of each of the position register stages (220$_0$ through 220$_t$). A root counter (207) maintains a count of the number of roots identified by the root detection block (200), which is used to sequentially select the register stages (218$_0$ through 218$_t$; 220$_0$ through 220$_t$) into which the zeroes and position values are stored.

18 Claims, 5 Drawing Sheets

COMBINED ERROR POSITION CIRCUIT AND CHIEN SEARCH CIRCUIT FOR REED-SOLOMON DECODING

CROSS-REFERENCE TO RELATED APPLICATIONS

This application claims the benefit, under 35 U.S.C. §119(e)(1), of U.S. Provisional Application No. 60/073,474, filed Feb. 3, 1998, which is incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuits for data communication, and is more specifically directed to error correction methods in the receipt of such communications.

Recent advances in the electronics field have now made high-speed digital data communications prevalent in many types of applications and uses. Digital communication techniques are now used for communication of audio signals for telephony, with video telephony now becoming available in some locations. Digital communication among computers is also prevalent, particularly with the advent of the Internet; of course, computer-to-computer networking by way of dedicated connections (e.g., local-area networks) and also by way of dial-up connections has also become prevalent in recent years.

Of course, the quality of communications carried out in these ways depends upon the accuracy with which the received signals match the transmitted signals. Some types of communications, such as audio communications, can withstand bit loss to a relatively large degree. However, the communication of digital data, especially of executable programs, requires exact fidelity in order to be at all useful. Accordingly, various techniques for the detection and correction of errors in communicated digital bit streams have been developed. Indeed, error correction techniques have effectively enabled digital communications to be carried out over available communication facilities, such as existing telephone lines, despite the error rates inherent in high-frequency communication over these facilities.

Error correction may also be used in applications other than the communication of data and other signals over networks. For example, the retrieval of stored data by a computer from its own magnetic storage devices also typically utilizes error correction techniques to ensure exact fidelity of the retrieved data; such fidelity is, of course, essential in the reliable operation of the computer system from executable program code stored in its mass storage devices. Digital entertainment equipment, such as compact disc players, digital audio tape recorders and players, and the like also now typically utilize error correction techniques to provide high fidelity output.

An important class of error detection and error correction techniques is referred to as Reed-Solomon coding, and was originally described in Reed and Solomon, "Polynomial Codes over Certain Finite Fields", *J. Soc. for Industrial and Applied Mathematics*, Vol. 8 (SIAM, 1960), pp. 300–304. Reed-Solomon coding uses finite-field arithmetic, such as Galois field arithmetic, to map blocks of a communication into larger blocks. In effect, each coded block corresponds to an over-specified polynomial based upon the input block.

Considering a message as made up of k m-bit elements, a polynomial of degree n−1 may be determined as having n coefficients; with n greater than k (i.e., the polynomial is overspecified), not all of the n coefficients need be valid in order to fully and accurately recover the message. According to Reed-Solomon coding, the number t of errors that may be corrected is determined by the relationship between n and k, according to $$t \le \frac{n-k}{2}.$$

Reed-Solomon encoding is used to generate the encoded message in such a manner that, upon decoding of the received encoded message, the number and location of any errors in the received message may be determined. Conventional Reed-Solomon encoder and decoder functions are generally implemented, in microprocessor-based architectures, as dedicated hardware units that are not in the datapath of the central processing unit (CPU) of the system, as CPU functionality has not heretofore been extended to include these functions.

In this regard, FIG. 1 illustrates one example of an architecture for a conventional Reed-Solomon encoder, for the example where each symbol is eight bits, or one byte, in size (i.e., m=8), where Galois field arithmetic is used such that the size of the Galois field is $2^8$, and where the maximum codeword length is $2^8-1$, or 255 symbols. Of course, other architectures may be used to derive the encoded codeword for the same message and checksum parameters, or of course for other symbol sizes, checksum lengths, or maximum codeword lengths. In the example of FIG. 1, sixteen check symbols are generated for each codeword, and as such eight errors per codeword may be corrected. According to conventional Reed-Solomon encoding, the k message bytes in the codeword ($M_{k-1}$, $M_{k-2}$, ..., $M_0$) are used to generate the check symbols ($C_{15}$, $C_{14}$, ..., $C_0$). The check symbols C are the coefficients of a polynomial C(x)

$$C(x) = C_{13}x^{15} + C_{14}x^{14} + \ldots + C_0$$

which is the remainder of the division of a message polynomial M(x) having the message bytes as coefficients:

$$M(x) = M_{k-1}x^{k-1} + M_{k-2}x^{k-2} + \ldots + M_0$$

by a divisor referred to as generator polynomial G(x):

$$G(x) = (x-a^0)(x-a^1)(x-a^2)\ldots(x-a^{15})$$

where each value is a root of the binary primitive polynomial $x^8+x^4+x^3+x^2+1$. The exemplary architecture of FIG. 1 includes sixteen eight-bit shift register latches $6_{15}$ through $6_0$, which will contain the remainder values from the polynomial division, and thus will present the checksum coefficients $C_{15}$ through $C_0$, respectively. An eight-bit exclusive-OR function $8_{15}$ through $8_1$ is provided between each pair of shift register latches 6 to effect Galois field addition, with XOR function $8_{15}$ located between latches $6_{15}$ and $6_{14}$, and so on. The feedback path produced by exclusive-OR function 2, which receives both the input symbol and the output of the last latch $6_{15}$, presents the quotient for each division step. This quotient is broadcast to sixteen constant Galois field multipliers $4_{15}$ through $4_0$, which multiply the quotient by respective ones of the coefficients $G_{15}$ through $G_0$. In operation, the first k symbols contain the message itself, and are output directly as the leading portion of the codeword.

Each of these message symbols enters the encoder architecture of FIG. 1 on lines IN, and is applied to the division operation carried out by this encoder. Upon completion of the operations of the architecture of FIG. 1 upon these message bytes, the remainder values retained in shift register latches $6_{15}$ through $6_0$ correspond to the checksum symbols $C_{15}$ through $C_0$, and are appended to the encoded codeword after the k message symbols.

The encoded codewords are then communicated in a digital bitstream, and communicated in the desired manner, after the appropriate formatting. For communications over telephone facilities, of course, the codewords may be communicated either digitally or converted to analog signals; digital network or intracomputer communications will, of course, maintain the codewords in their digital format. Regardless of the communications medium, errors may occur in the communicated signals, and will be reflected in the received bitstream as opposite binary states from those in the input bitstream, prior to the encoding process of FIG. 1. These errors are sought to be corrected in the decoding process, as will now be described in a general manner relative to FIG. 2.

An example of the decoding of Reed-Solomon encoded codewords, generated for example by the architecture of FIG. 1, is conventionally carried out in the manner now to be described relative to decoder 10 illustrated in FIG. 2. Decoder 10 receives an input bitstream of codeword symbols, which is considered, for a single codeword, as received polynomial r(x) in FIG. 2. Received polynomial r(x) is applied to syndrome accumulator 12, which generates a syndrome polynomial s(x) of the form:

$$s(x)=s_{i-1}x^{i-1}+s_{i-2}x^{i-2}+\ldots+s_1x+s_0$$

Syndrome polynomial s(x) is indicative of whether errors were introduced into the communicated signals over the communication facility. If s(x)=0, no errors were present, but if s(x) is non-zero, one or more errors are present in the codeword under analysis. Syndrome polynomial s(x), in the form of a sequence of coefficients, is then forwarded to Euclidean array function 15.

Euclidean array function 15 generates two polynomials Λ(x) and Ω(x) based upon the syndrome polynomial s(x) received from syndrome accumulator 12. The degree v of error locator polynomial Λ(x) indicates the number of errors in the codeword, and as such is forwarded to Chien search function 16 for additional analysis. Polynomial Ω(x) is also generated by Euclidean array function 15, and is forwarded to Forney function 18 for use in evaluation of the error in the received bitstream r(x).

As noted above, the coefficients of the error locator polynomial Λ(x) generated by Euclidean array function 15 are applied to Chien search function 16 in this conventional Reed-Solomon decoder. Chien search function 16 utilizes these coefficients, along with the particular finite field "alphabet", or set of finite field values, to generate a polynomial, generally referred to as zeroes polynomial X(x), that is used in further identifying the errors in the received bitstream r(x). Zeroes polynomial X(x) is applied to Forney function 18 for determination of the eventual error magnitude polynomial M(x). Chien search function 16 also forwards zeroes polynomial X(x) to error position circuit 17 which generates error position polynomial P(x) therefrom. Error magnitude polynomial M(x) and error position polynomial P(x) are forwarded to input ring buffer 19 as an indication of the magnitude and position, respectively, of the errored symbols in the bitstream r(x). Input ring buffer 19 then generates the output bitstream i'(x) by effectively subtracting the designated error magnitude from the identified position of the error, so that output bitstream i'(x) faithfully represents input bitstream r(x).

Referring now to FIG. 3, an example of the construction and operation of a conventional custom logic implementation of error position circuit 17 will now be described in detail. As shown in FIG. 3, data words corresponding to terms of zeroes polynomial X(x) are received by multiplexer 20 of error position circuit 17; in this example of Galois field (204, 188, 8) Reed-Solomon decoding, zeroes polynomial includes, in this example, eight-bit terms X(0) through X(t), where t is the number of correctable errors. Of course, the higher-order terms of zeroes polynomial X(x) will be zero if the number of detected roots is less than its maximum. The output of multiplexer 20 forwards the selected one of the terms of zeroes polynomial X(x) to Galois field divide circuit 28, the quotient of which is then forwarded to Galois field logarithm circuit 29. Accordingly, error position circuit 17 generates a term P(i) of the error position polynomial P(x) by performing the following operations upon a corresponding term X(i) of zeroes polynomial X(x):

$$P(i)=GF\_log\,[GF\_div(1,X(i)]$$

Accordingly, error position term P(i) is derived as the logarithm of the reciprocal of the value of the corresponding zeroes term X(i).

Multiplexer 20 is controlled responsive to a count generated by adder 22 and register 24. According to this conventional example, adder 22 receives a unity input at one input, and the output of register 24 at its other input; the output of adder 22 is applied to the input of register 24. As such, adder 22 increments the contents of register 24 each machine cycle, advancing the count accordingly. In this conventional circuit, after all of the values of zeroes polynomial X(x) have been generated by Chien search function 16, adder 22 and register 24 count from zero to the number t of correctable errors; the output of register 24 is applied to a control input of multiplexer 20, such that multiplexer 20 forwards the term X(i) to Galois field divide circuit 28 responsive to receiving the count value i from register 24 at its control input. The output of register 24 is also applied to decoder 26, which decodes the count into t enable signals EN(0) through EN(t) that control the operation of corresponding ones of registers $30_0$ through $30_t$ as will now be described.

The output of Galois field logarithm circuit 29 is applied to the data input of each of registers $30_0$ through $30_t$. The outputs of registers $30_0$ through $30_t$ present terms P(0) through P(t), respectively, of error position polynomial P(x) to input ring buffer 19 (FIG. 2). Each of registers $30_0$ through $30_t$ is enabled by its corresponding one of enable signals EN(0) through EN(t), such that the output of Galois field logarithm circuit 29 is stored by only the one of registers $30_0$ through $30_t$ corresponding to the current value of the count presented to multiplexer 20 by register 24. This operation, of course, ensures that the logarithm of the reciprocal of the selected term of zeroes polynomial X(x) is stored in the corresponding one of registers $30_0$ through $30_t$.

According to conventional techniques, Galois field divide circuit 28 and Galois field logarithm circuit 29 are each implemented by way of look-up tables, generally realized as read-only-memories (ROMs). The look-up table entries of Galois field divide circuit 28 include the Galois field reciprocal of their respective addresses, thus effecting the reciprocal operation. Similarly, the look-up table entries of Galois field logarithm circuit 29 store the Galois field natural logarithm of their respective addresses. The number of equivalent gates consumed by Galois field divide circuit 28 and Galois field logarithm circuit 29 is quite substantial, according to conventional realizations. According to one exemplary technology, 630.75 gates are required to realize Galois field divide circuit 28, and 631 gates are required to realize Galois field logarithm circuit 29. As a result, the realization of error position circuit 17, excluding error position registers 30, consumes 1367.25 equivalent gates. The implementation of error position circuit 17 in custom logic circuitry thus involves significant chip area.

BRIEF SUMMARY OF THE INVENTION

It is therefore an object of the present invention to provide an efficient implementation of Chien search and error position locating circuitry for use in Reed-Solomon decoding.

It is a further object of the present invention to provide such circuitry that may be realized without look-up tables for the error position circuitry.

It is a further object of the present invention to provide such circuitry that may be implemented into a programmable logic device such as a digital signal processor or microprocessor.

Other objects and advantages of the present invention will be apparent to those of ordinary skill in the art having reference to the following specification together with its drawings.

The present invention may be implemented into logic circuitry for performing Reed-Solomon decoding. Error position results, based upon the detection of zeroes by a Chien search function, are generated by subtracting, from the maximum finite field value minus one, a count corresponding to the power representation of a detected root of an error locator polynomial Λ(x) from Euclidean array processing. The value of this subtraction exactly equals the byte position within the frame of an errored byte, and thus may be used to indicate the position of errors in the input bitstream. Accordingly, the error position polynomial P(x) may be generated without performing the logarithm of the reciprocal of the members of the Chien search zeroes polynomial.

DETAILED DESCRIPTION OF THE INVENTION

According to the preferred embodiment of the present invention, a combined Chien search and error position function is implemented as a functional unit within a programmable logic device, such as a digital signal processor (DSP) or general purpose microprocessor, realized as an integrated circuit. This functional unit is preferably operated by way of a special instruction which presents the appropriate operands to the Chien search and error position functions, storing the results thereof in on-chip memory in a form in which the programmable logic device itself, or another integrated circuit operating in cooperation therewith, may utilize in receiving communications that are communicated thereto in Reed-Solomon encoded form. Of course, the particular architecture utilizing the function according to the preferred embodiment of the invention may vary from that described herein, it being understood that many different types of architectures and programmable logic devices may benefit from the use of the present invention. More specifically, it is further contemplated that the combined Chien search and error position function according to the present invention may alternatively be implemented by way of a custom logic circuit, either as a stand alone realization of such a function or integrated with other functions as an integrated Reed-Solomon decoder device, such as a co-processor or dedicated subsystem. As such, it is to be understood that the following description is provided by way of example only, and is not intended to limit the scope of the present invention as hereinafter claimed.

Figure 4:
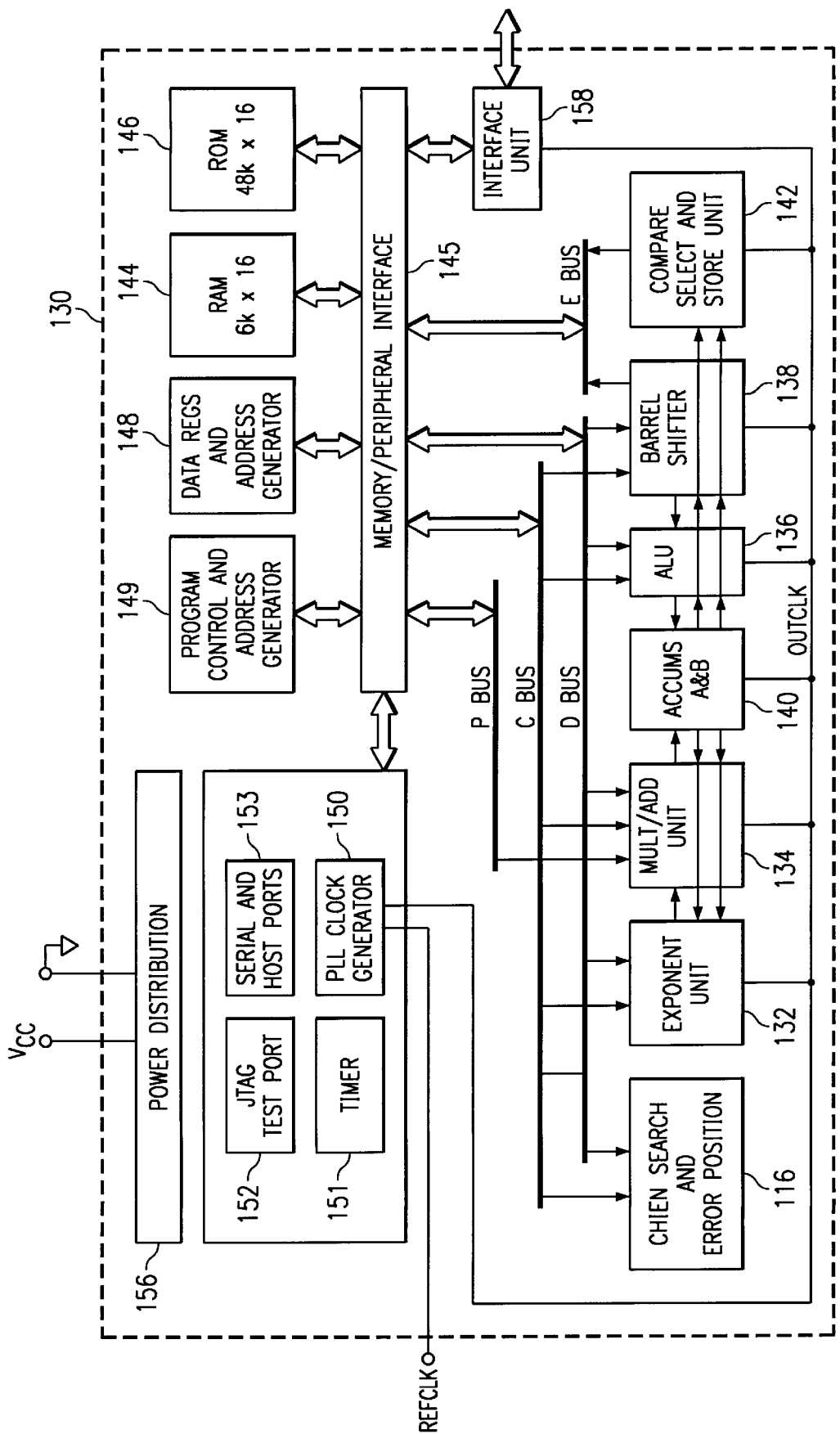
FIG. 4 is an electrical diagram, in block form, of a digital signal processor constructed according to the preferred embodiments of the invention.

An example of a programmable logic device, in the form of digital signal processor (DSP) integrated circuit 130, into which the preferred embodiment of the invention may be implemented is illustrated in FIG. 4. The architecture illustrated in FIG. 4 for DSP 130 is presented by way of example, as it will be understood by those of ordinary skill in the art that the present invention may be implemented into integrated circuits of various functionality and architecture, including custom logic circuits, general purpose microprocessors, and other VLSI and larger integrated circuits.

DSP 130 in this example is implemented by way of a modified Harvard architecture, and as such utilizes three separate data buses C, D, E that are in communication with multiple execution units including exponent unit 132, multiply/add unit 134, arithmetic logic unit (ALU) 136, barrel shifter 138; in addition, Chien search and error position function 116 is provided as another execution unit in DSP 130 according to the preferred embodiment of the present invention. Accumulators 140 permit operation of multiply/add unit 134 in parallel with ALU 136, allowing simultaneous execution of multiply-accumulate (MAC) and arithmetic operations. The instruction set executable by DSP 130, in this example, includes single-instruction repeat and block repeat operations, block memory move instructions, two and three operand reads, conditional store operations, and parallel load and store operations, as well as dedicated digital signal processing instructions. Additionally, as will be described in further detail hereinbelow, Chien search instructions are provided in the instruction set of DSP 130 according to the preferred embodiment of the invention. DSP 130 also includes compare, select, and store unit (CSSU) 142, coupled to data bus E, for accelerating Viterbi computation, as useful in many conventional communication algorithms.

DSP 130 in this example includes significant on-chip memory resources, to which access is controlled by memory/peripheral interface unit 145, via data buses C, D, E, and program bus P. These on-chip memory resources include random access memory (RAM) 144, read-only memory (ROM) 146 used for storage of program instructions, and data registers 148. Program controller and address generator circuitry 149 is also in communication with memory/peripheral interface 145, and receives program instruction code from ROM 146 or from other storage via memory/peripheral interface 145, and generates control signals applied to each of the functional units of DSP 130 to control the execution of instructions corresponding to the received program instruction code. Interface unit 158 is also provided in connection with memory/peripheral interface 145 to control external communications, as do serial and host ports 153. Additional control functions such as timer 151 and JTAG test port 152 are also included in DSP 130.

According to this preferred embodiment of the invention, the various logic functions executed by DSP 130 are effected in a synchronous manner, according to one or more internal system clocks generated by PLL clock generator 150. In this exemplary implementation, PLL clock generator 150 directly or indirectly receives an external clock signal on line REFCLK, such as is generated by other circuitry in the system or by a crystal oscillator or the like, and generates internal system clocks, for example the clock signal on line OUTCLK, communicated (directly or indirectly) to each of the functional components of DSP 130. DSP 130 also includes power distribution circuitry 156 for receiving and distributing the power supply voltage and reference voltage levels throughout DSP 130 in the conventional manner. Other functions, such as JTAG test interface circuitry, built-in self test circuitry, and the like may also be provided in DSP 130, in the conventional manner.

Additionally, other execution units may also be provided within DSP 130. For example, a Euclidean array execution unit may also be provided within DSP 130, coupled to each of the C and D buses in similar fashion as Chien search and error position function 116, for execution of a Euclidean array instruction. Detailed description of such a Euclidean array unit is provided in copending application Ser. No. 09/086,997, filed May 29, 1998, entitled "An Efficient Hardware Implementation of Euclidean Array Processing in Reed-Solomon Decoding", commonly assigned herewith and incorporated herein by this reference.

Figure 5:
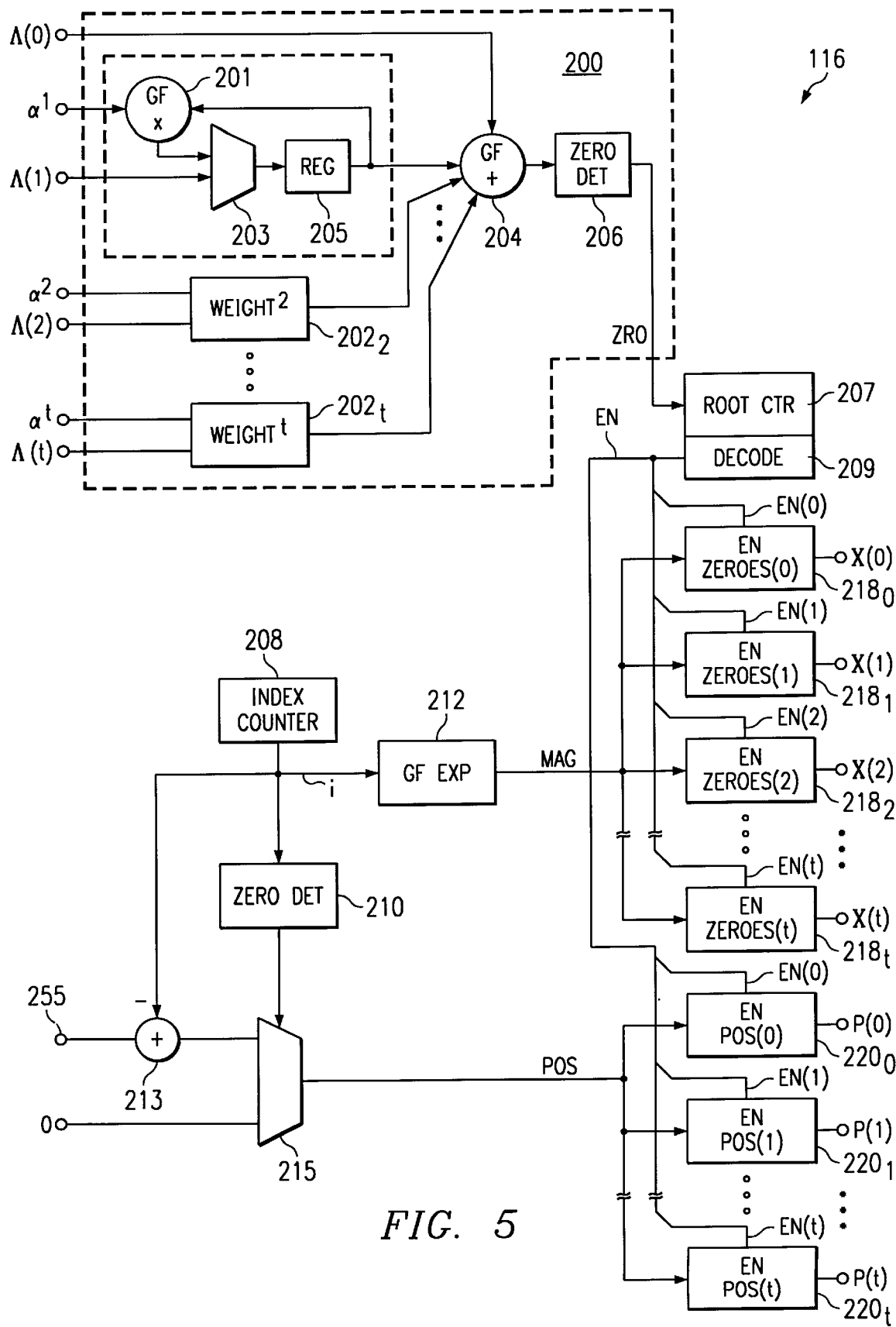
FIG. 5 is an electrical diagram, in block form, of a combined Chien search and error position circuit according to the preferred embodiment of the invention.

Referring now to FIG. 5, the construction and operation of Chien search and error position function 116 according to the preferred embodiment of the invention will now be described. In this approach, Chien search and error position function 116 includes root detection block 200. Root detection block 200 evaluates the following function:

$$X_i = \Lambda(\alpha^i) = \Lambda_0 + \sum_{j=1}^{v} \Lambda_j (\alpha^i)^j \text{ for } i = 1 \text{ to } 255$$

where the term $\alpha^i$ refers to the symbol alphabet for GF(256) Galois field arithmetic, which has 256 members. As noted above, the term v is the degree of the error locator polynomial $\Lambda(x)$ from Euclidean array function 15, and as such corresponds to the number of errors present in the received bitstream r(x). Because v is less than or equal to the number t of correctable errors for successful decoding, the calculation is generally carried out up for index j from 1 to t. Root detection block 200 performs this evaluation, in the example of FIG. 5, by way of multiple weighted sum blocks 202, in combination with a Galois field, finite field, adder 204 and zero detection circuitry 206, as will now be described.

As shown in FIG. 5, the lowest order coefficient $\Lambda(0)$ of error locator polynomial $\Lambda(x)$ is forwarded directly to Galois field adder 204. Each of the next higher order coefficients $\Lambda(x)$, the number of which is the number t of correctable errors, is forwarded to a corresponding one of weighted sum blocks 202, along with a corresponding power of the Galois field member $\alpha^i$. Because of the recursive construction of weighted sum blocks 202, the Galois field members $\alpha^i$ applied thereto may be maintained as constants. For example, weighted sum block 202$_1$ receives the first power Galois field member $\alpha^1$, along with coefficient $\Lambda(1)$, weighted sum block 202$_2$ receives the square, or second power, Galois field member $\alpha^2$ along with coefficient $\Lambda(2)$, and so on. Each of the first t powers of the Galois field symbol alphabet members $\alpha^i$ (i=1 to t) may be prestored in memory, to prevent the repeated calculation of the powers of $\alpha$.

Each weighted sum block 202 is similarly constructed in conventional Galois field function 16, including a multiplexer 203, a register 205, and a finite field (Galois field) multiplier 201. In operation, considering that the zeroth order Galois field member $\alpha^0$ is one, multiplexer 203 in each of weighted sum blocks 202 first selects the coefficient $\Lambda$ for storage in register 205; the output of register 205 is applied to Galois field adder 204, for determination of the first sum and thus possible detection of a root. Galois field adder 204 performs a finite field addition of the contents of each of the registers 205 in weighted sum blocks 202, along with lowest order coefficient $\Lambda(0)$, to evaluate the polynomial $X_i$ for the ith symbol alphabet member $\alpha^i$. The result of this addition is applied to zero detection circuit 206, which drives an active state on line ZRO in response to the sum equaling zero; this event occurs when the current Galois field symbol alphabet member $\alpha^i$ is a root of the zeroes polynomial X(x). For the second and subsequent members of the Galois field symbol alphabet, the constant values of Galois field symbols $\alpha^1$ through $\alpha^t$ are applied to Galois field multiplier 201 along with the current contents of register 205. Galois field multiplier 201 again performs the finite field multiplication of these two operands, and multiplexer 203 selects the output of multiplier 201 for storage in register 205, and for presentation to Galois field adder 204 and zero detection circuit 206, to detect whether a root is present at this iteration.

For example, in the second iteration, multiplier 201 performs Galois field multiplication of symbol $\alpha^1$ and the value $\Lambda(1)$ (the current contents of register 205 after the first iteration), and thus stores the value $\Lambda(1)\alpha^1$ in register 205 and forwards this value to adder 204; weighted sum block 202$_2$ similarly generates and stores the value $\Lambda(2)\alpha^2$, as do the remaining weighted sum blocks 202, up to block 202$_t$ which generates and stores the value $\Lambda(t)\alpha^t$. In the third iteration, multiplier 201 in weighted sum block 202$_1$ performs a Galois field multiplication of symbol $\alpha^1$ and the value $\Lambda(1)\alpha^1$ (the then-current contents of register 205 after the second iteration), and stores and forwards the resulting value $\Lambda(1)(\alpha^1)^2$, or $\Lambda(1)\alpha^2$. Similarly, in this third iteration, weighted sum block 202$_2$ generates and stores the value $\Lambda(2)(\alpha^2)^2$, or $\Lambda(2)\alpha^4$, as do the remaining weighted sum blocks 202, up to block 202$_t$ which generates and stores the value $\Lambda(t)(\alpha^t)^2$. This process continues for iterations of the index value i (corresponding to the exponent of the $\alpha$ term in each multiplication) from 1 to 255 in the case of Galois field 256 operations, so that each symbol of the Galois field symbol alphabet is interrogated to determine whether it is a root.

Figure 6:
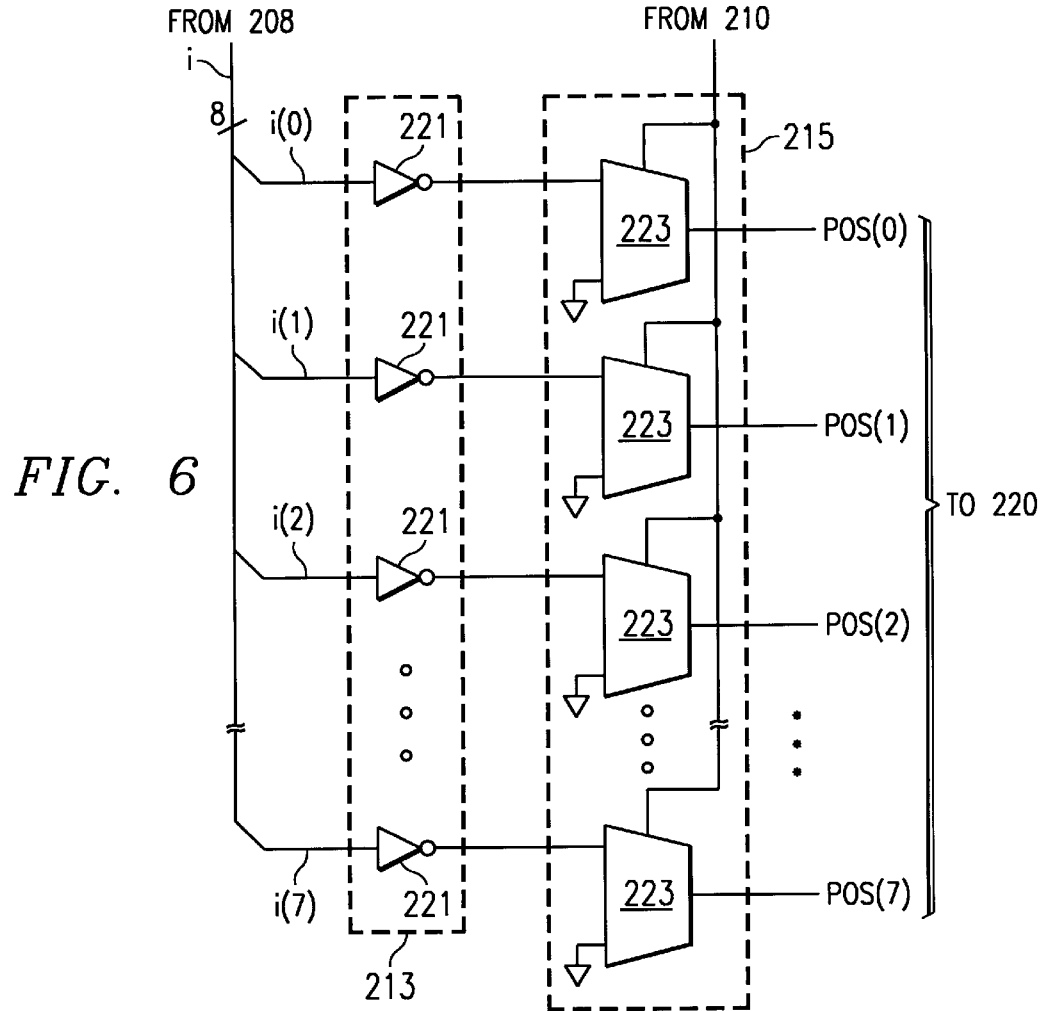
FIG. 6 is an electrical diagram, in schematic form, of an exemplary realization of the adder and multiplexer in the combined Chien search and error position circuit of FIG. 5 according to the preferred embodiment of the invention.

Alternatively to the construction of root detection block 200 of FIG. 6, other architectures are also applicable to the detection of roots in the performing of the Chien search function. A description of such an alternative architecture that is particularly suited for implementation into a digital signal process or other programmable logic device, is provided in copending application Ser. No. 09/087,584, filed May 29, 1998, entitled "An Efficient Hardware Implementation of Chien Search Polynomial Reduction in Reed-Solomon Decoding", commonly assigned herewith, and incorporated by reference hereinto.

Line ZRO is applied to root counter 207. Root counter 207, which is reset prior to the evaluation of each sequence of error locator polynomial Λ(x), is incremented in response to each active pulses on line ZRO, and thus counts the number of roots detected by root detection block 200 (by counting the number of active pulses on line ZRO). Decoder 209 decodes the value stored in root counter 207, and generates individual signals EN(0) through EN(t) on enable bus EN, which are forwarded to the enable input of corresponding stages of two registers 218, 220. In this example, each of register stages $218_0$ and $220_0$ receives enable line EN(0) at its enable input, each of register stages $218_1$ and $220_1$ receives enable line EN(1) at its enable input, and so on. According to this embodiment of the invention, decoder 209 is gated by line ZRO, such that an active signal is generated by decoder 209 on enable bus EN only in response to root detection; all enable lines EN(0) through EN(t) are maintained inactive if no root was detected (i.e., if line ZRO is inactive).

Register 218 includes stages $218_0$ through $218_t$ for storing coefficient values of zeroes polynomial X(x) therein. According to this conventional arrangement, index counter 208 maintains a count corresponding to the iteration of the Galois field symbol alphabet members α through root detection circuit 200. This count is applied to Galois field exponential circuit 212, typically constructed as a look-up ROM, which generates a magnitude value on lines MAG in response to the count; this magnitude is applied to the data inputs of register stages $218_0$ through $218_t$. According to the preferred embodiment of the invention, upon detection of a root of zeroes polynomial X(x) as indicated by an active state on line ZRO, the magnitude value on lines MAG is stored in the first available one of register stages $218_0$ through $218_t$, as enabled by an active signal on the one of enable lines EN that corresponds to the current value of root counter 207. Once the first one of the stages $218_k$ of register 218 has a value stored therein, the magnitude value on lines MAG at the time of the next detected root is stored in the next stage $218_k$ in sequence ($218_0$, then $218_1$, and so on), under the control of the signals on enable bus EN as generated by root counter 207 and decoder 209. Upon completion of the Chien search operation, register 218 will then store individual magnitude values for each of the detected roots.

As discussed above in the background of the invention, one may determine the various coefficients in the error position polynomial P(x) from the logarithm of the reciprocal of the count corresponding to the iteration of the Galois field symbol alphabet members α applied to root detection block 200. This count is, as noted above, maintained by index counter 208. For example, if the $i^{th}$ iteration of Galois field symbol alphabet members α results in a detected root (i.e., line ZRO is driven active), one may derive the corresponding error position polynomial term P(i) as follows:

$$P(i) = \log\left[\frac{1}{\alpha^i}\right]$$

It has been observed, according to the present invention, that this relationship may be rewritten as follows (again, for values of i that drive line ZRO active):

$$P(i) = (2^M - 1) - i \quad \text{for } i \neq 0$$
$$P(i) = 0 \quad \text{for } i = 0$$

where m is the number of bits of the finite field (e.g., Galois field) members. For Galois field 256, m=8. This observation enables a significant simplification in the generation of the error position polynomial coefficients P(x), as will now be described.

According to the preferred embodiment of the invention, error position polynomial P(x) is also generated from the count stored in index counter 208. The output of index counter 208 is applied to an inverting input to adder 213, which receives the literal value "255" at a non-inverting input; the output of adder 213 is thus the quantity of 255 minus this count, and is applied to one input of multiplexer 215. The literal "0" value is applied to a second input of multiplexer 215, which is under the control of zero detection circuit 210 which detects when the count provided by index counter 208 reaches zero. Register 220 includes stages $220_0$ through $220_t$, which store position values in the form of coefficients of position polynomial P(x), each stage $220_k$ receives a corresponding enable line EN(k) from decode 209 at an enable input, and receives lines POS from the output of multiplexer 215 at a data input.

In operation, the process begins with resetting of index counter 208 and root counter 207 to zero, corresponding to the operation of root detection block 200 performing the first iteration of root detection. At this time, the output of index counter (i.e., the value i) is zero, in response to which zero detection circuit 210 controls multiplexer 215 to select the 0 level for application to lines POS to register 220. Upon root detection function 200 detecting a root of zeroes polynomial X(x) at this time (i=0), as indicated by line ZRO being active, decoder 209 will generate an active enable signal on line EN(0) (since this root will necessarily be the first). The value of 0 will then be stored in register stage $220_0$, and the Galois field exponent of zero, namely unity, will be stored in register stage $218_0$. Of course, if no root is detected at this point, root counter 207 will remain at its zero level and, as described above, no enable signal will be generated by decoder 209.

After this first iteration of i=0, index counter 208 is advanced. For all subsequent iterations, the value 255-i is generated by adder 213, and is selected by multiplexer 215 since count i is no longer zero. The value 255-i is then presented on lines POS for each subsequent iteration through the Galois field alphabet by root detection block 200. Upon root detection block 200 detecting a root, as indicated by an active state on line ZRO, the value 255-1 on lines POS at that time will be stored in the next available stage $220_k$ of register 220, beginning with stage $220_0$ if no root was detected in earlier iterations. The process then continues, with additional detected roots resulting in additional position values being stored in stages $220_k$.

The stored values in register 220 indicate the position of errors in the received bitstream, as coefficients P(0) through P(t). These coefficients indicate the position of the errored bytes in the incoming bitstream, and are forwarded to an input ring buffer function for analysis, as will be described in further detail below.

According to this embodiment of the invention, significant efficiency in chip area, hardware complexity, and computational cost is obtained from the present invention. The subtraction of 255 from an eight-bit number, as performed by adder 213, may be easily implemented by way of eight inverters. An example of such an implementation will now be described relative to FIG. 6.

As shown in FIG. 6, adder 213 is realized as a series of inverters 221, each inverter 221 associated with a corresponding individual line i(0) through i(7) of eight-line bus i from index counter 208. The output of each inverter 221 is applied to one bit of a corresponding two-bit multiplexer 223, the other input of which is biased to ground (i.e., a "0" state); the control input of each multiplexer 223 is connected to the output of zero detection circuit 210. Multiplexers 223 collectively correspond to multiplexer 215 of FIG. 5. The output of each multiplexer 223 drives one of lines POS(0) through POS(7), which collectively correspond to bus POS that is forwarded to each stage $220_0$ through $220_t$ of register 220, as shown in FIG. 5.

This realization of the error position circuitry portion of Chien search and error position circuit 116 may be realized in very few equivalent gates. For example, according to a conventional technology, the circuitry of FIG. 6 may be realized in 22.75 gates; as noted above, according to this same technology, the look-up tables used in conventional error position circuitry occupy 1367.25 equivalent gates. As a result of the present invention, therefore, a significant amount of circuitry is saved according to the present invention, facilitating the implementation of this function into a digital signal processor or other programmable logic device.

Figure 1:
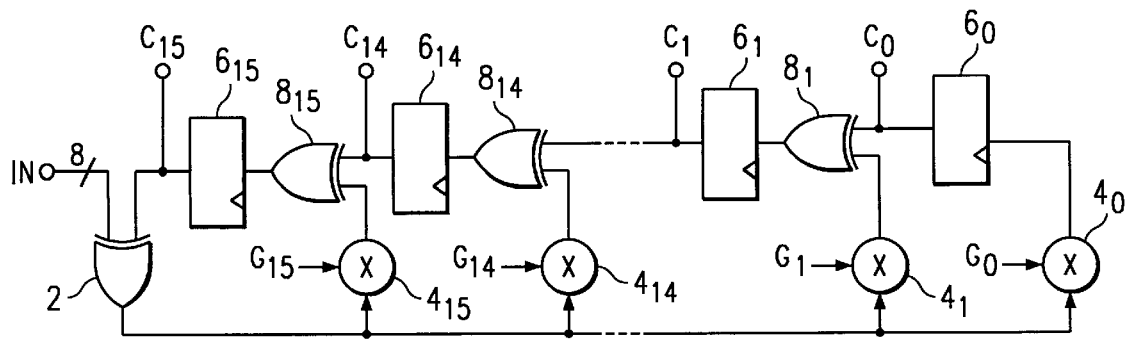
FIG. 1 is an electrical diagram, in schematic form, of a conventional Reed-Solomon encoder architecture.
Figure 2:
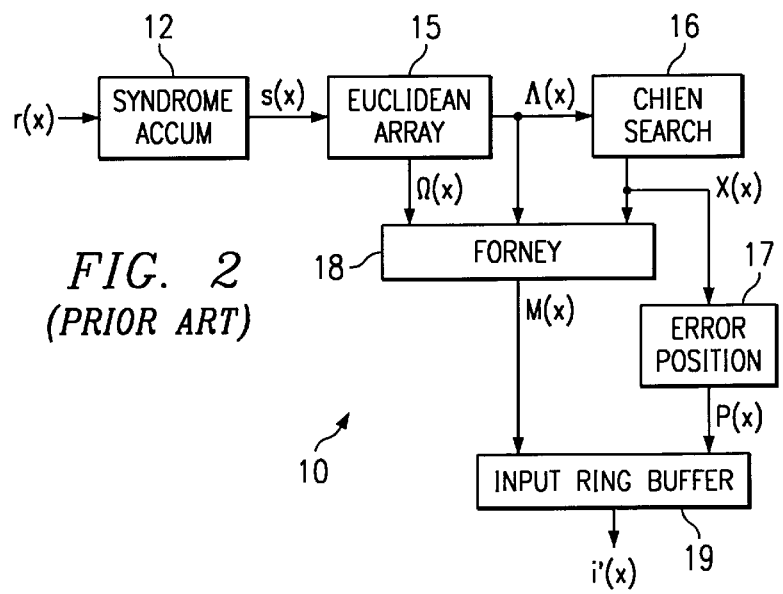
FIG. 2 is an electrical diagram, in block form, of a conventional Reed-Solomon decoder architecture.
Figure 3:
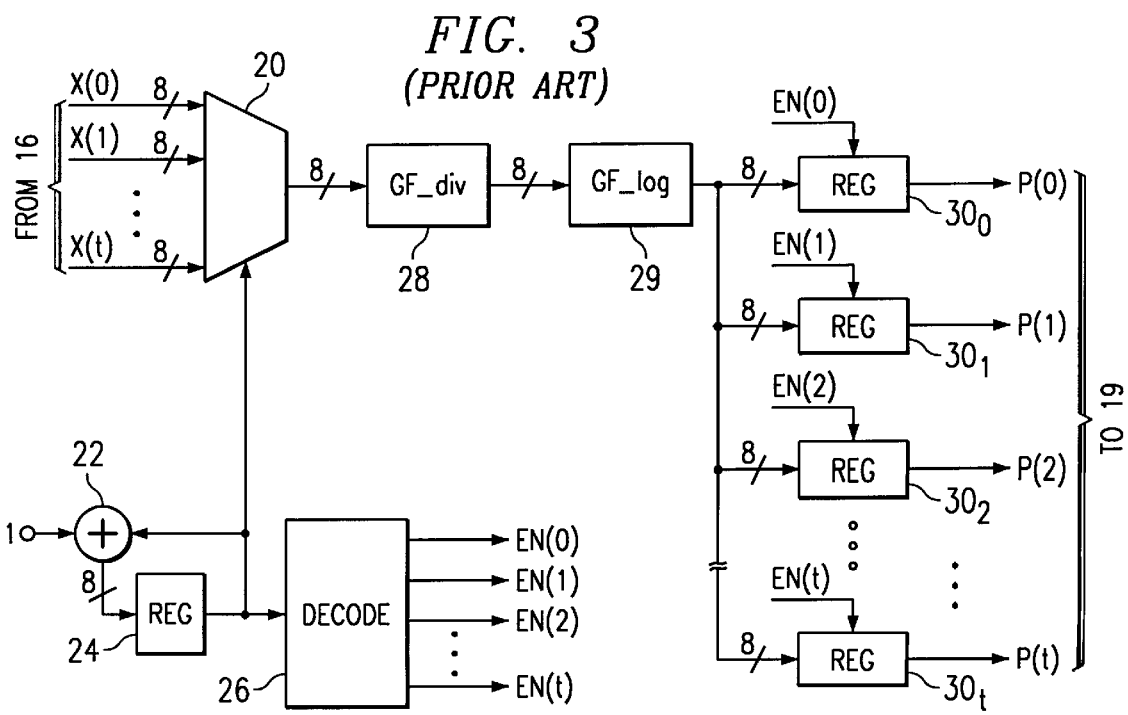
FIG. 3 is an electrical diagram, in block form, of a conventional error position circuit in the Reed-Solomon decoder architecture of FIG. 2, according to the prior art.
Figure 7:
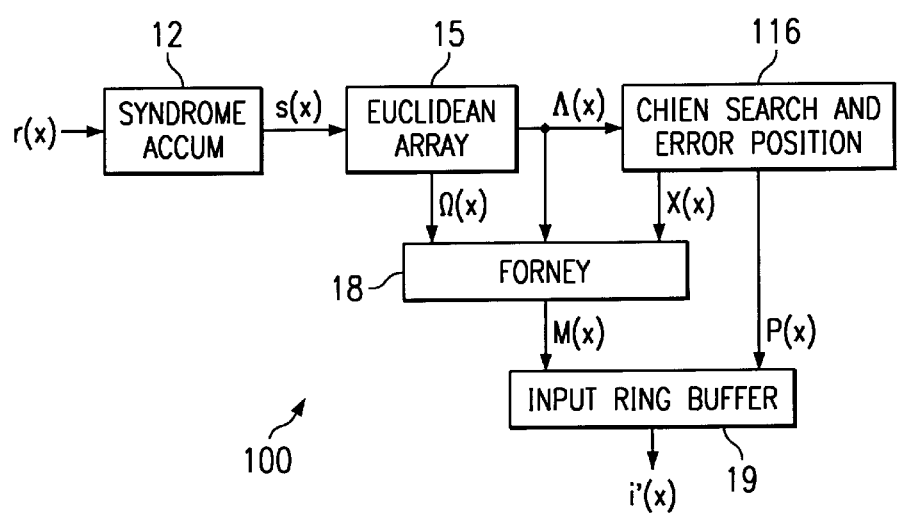
FIG. 7 is an electrical diagram, in block form, of Reed-Solomon decoder architecture including the combined Chien search and error position function according to the preferred embodiment of the invention.

Referring now to FIG. 7, the overall architecture of Reed-Solomon decoder 100, according to this preferred embodiment of the invention, will now be described, like reference numerals are used to refer to similar Reed-Solomon functions as discussed above relative to FIG. 2. As noted above relative to FIG. 4, the architecture illustrated in FIG. 7 may refer to a sequence of software-embodied functions, for example as may be carried out by DSP 130; alternatively, Reed-Solomon decoder 100 may be realized as custom logic, in which each of the functional blocks therein are individual logic circuits.

As shown in FIG. 7, and similarly as described above relative to FIG. 2, decoder 100 receives an input bitstream of codeword symbols, as received polynomial r(x) and applies these coefficient terms to syndrome accumulator 12, which generates a corresponding syndrome polynomial s(x), which indicates whether errors were introduced into the communicated signals over the communication facility. Euclidean array function 15 generates two polynomials Λ(x) and Ω(x) based upon the syndrome polynomial s(x) received from syndrome accumulator 12. Polynomial Ω(x) is forwarded to Forney function 18, for use in evaluation of the error in the received bitstream r(x).

Error locator polynomial Λ(x), the degree v of which indicates the number of errors in the codeword, is forwarded to Chien search and error position function 116 for analysis. As described above relative to FIG. 5, Chien search and error position function 116 evaluates error locator polynomial Λ(x) and generates zeroes polynomial X(x), the coefficients of which are stored in register 218 and applied to Forney function 18 for determination of the eventual error magnitude polynomial M(x). Chien search and error position function 116 also generates error position polynomial P(x), the coefficients of which are stored in register 220 and are forwarded to input ring buffer 19 as an indication of the position of the errored symbols in the bitstream r(x). Input ring buffer 19 then generates the output bitstream i'(x) in the conventional manner, producing output bitstream i'(x) as a faithful representation of input bitstream r(x).

Figure 8:
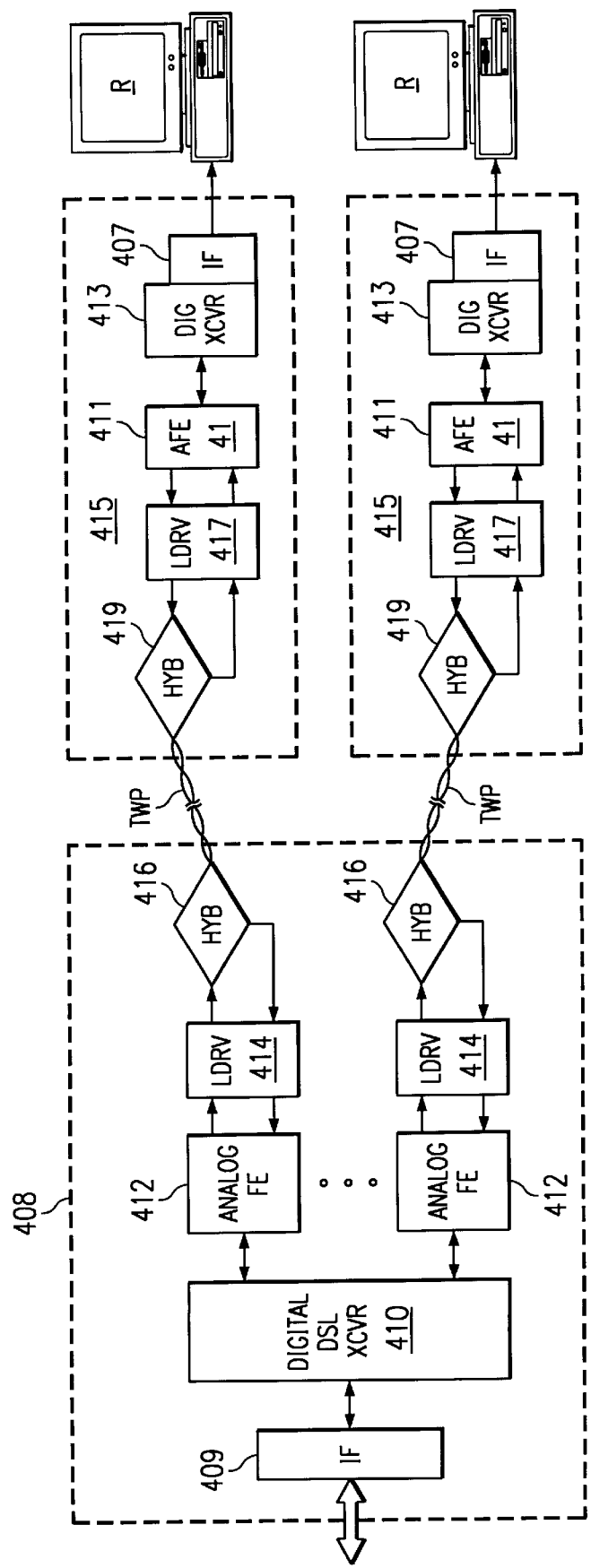
FIG. 8 is an electrical diagram, in block form, of a digital subscriber line (DSL) communication system into which the preferred embodiments of the invention may be implemented.

Referring now to FIG. 8, an example of an electronic system into which the present invention may be beneficially implemented will now be described by way of example; this exemplary system corresponds to digital subscriber line (DSL) modems, particularly those of the asynchronous type (i.e., ADSL modems), in which the modem at the remote user differs from that at the telephone system central office. As communication carried out by modems over telephone lines typically involves Reed-Solomon decoding, it is contemplated that the present invention will be particularly beneficial in this application. As such, FIG. 8 illustrates an example of such an application, in which DSP 130 as described above is included within digital subscriber line (DSL) modems in a telecommunications system.

FIG. 8 illustrates a typical system installation of DSL services, in which multiple remote subscribers interface with a telephone system central office. In this example, a user in a home or office environment operates remote computer system R, such as a personal computer or workstation, or alternatively an entertainment unit in the video-on-demand (VOD) context. Each of remote computer systems R serves as a remote source and destination of communicated data, which may be representative of text, graphics, motion pictures, audio, etc. Each remote system R is associated with a remote DSL modem 415, by way of which the remote system R communicates with central office DSM modem 408 over a conventional twisted-pair telephone facility TWP. One or more telephones (not shown) may also be connected into each twisted pair wire facility TWP, such that "Plain Old Telephone Service" (POTS) voice communications may alternatively or additionally be communicated over twisted pair wire facility TWP. The DSL technology in the specific example of FIG. 8 may be of the asymmetric type (i.e., ADSL), with traffic traveling from central office modem 408 to remote modems 415 at a signal bandwidth that is higher in frequency than that of traffic traveling from remote modems 415 to central office modem 408 (i.e., upstream).

As illustrated in FIG. 8, each of twisted pair wire facilities TWP is received by central office DSL modem 408, which is contemplated to be located in a central office of the local or long distance telephone service provider. Central office modem 408, in this example, is capable of receiving multiple twisted pair wire facilities TWP (only two of which are illustrated in this example). Central office modem 408 provides communication of data between twisted pair wire facilities TWP, and thus remote systems R, and a host computer (not shown in FIG. 8) which serves as the source or destination of data, or as an intermediate gateway to a network, such as the Internet, or a dedicated "dial-up" content provider or network. Of course, the central office will typically also include switchgear for the routing of calls such as those placed by remote systems R (or associated telephones) over twisted pair wire facilities TWP. As noted above, central office modem 408 will likely be connected to a backbone network, which in turn is in communication with other communication paths by way of equipment such as routers or Digital Subscriber Line Access Multiplexers (DSLAMs). In the application where POTS service overlays the ADSL data traffic, such equipment may also include some type of "splitter" for separating POTS from the data traffic, routing the POTS traffic to the conventional telephone network (PSTN) and routing the data to a wide-area network (WAN).

In the example of FIG. 8, remote DSL modems 415 are each arranged as a plurality of functions, which roughly correspond to individual integrated circuits in this exemplary embodiment of the invention. It is of course to be understood that the particular integrated circuit, or "chip", boundaries among these various functions may vary among implementations; the exemplary realization illustrated in FIG. 8 is provided by way of example only. In this example, each of remote DSL modems 415 include a host interface 407, for interfacing digital transceiver function 413 with its associated remote system R. Host interface 407 is of conventional construction for such interface functions, an example of which is the TNETD2100 digital serial bus interface circuit available from Texas Instruments Incorporated.

According to this embodiment of the invention, digital transceiver function 413 in remote DSL modems 415 is a programmable device for executing the necessary digital processing operations for both transmission and receipt of the data payload. These operations include such functions as formatting of the digital data from the host computer system (into packets and frames, for example), encoding of the data into appropriate subchannels for transmission, and performing an inverse Fast Fourier Transform (IFFT) to transform the encoded data into time domain signals; on the receive side, digital transceiver function 413 performs the reverse of these operations, as well as echo cancellation processing. Particularly at the data rates discussed hereinabove, the digital data processing capacity and power of digital transceiver function 413 is preferably of a high level, preferably with capability on the order of that provided as digital signal processors of the TMS320C6x type, available from Texas Instruments Incorporated. According to the preferred embodiment of the invention, digital transceiver function 413 is implemented by way of DSP 130 described hereinabove, including the provision of the combined Chien search and error position execution unit 116 as described above, which efficiently implements these important functions under the control of instructions in the instruction set of DSP 130. The Reed-Solomon decoding operation carried out by digital transceiver function 413, implemented as DSP 130 according to the preferred embodiment of the invention, is applied to encoded signals that are communicated over its associated twisted pair facility TWP from central office modem 408, and which are processed through hybrid 419, line driver 415, and AFE 411, so as to be received by digital transceiver function 413 in digital form. Following the Reed-Solomon decoding operation carried out by way of digital transceiver function 413, implemented as DSP 130 according to the preferred embodiment of the invention, the decoded digital signals are then communicated to remote system R via interface 407.

Each digital transceiver function 413 is bidirectionally connected to AFE 411, which is a mixed-signal (i.e., involving both digital and analog operations) integrated circuit which provides all loop interface components necessary for DSL communications other than those which involve high voltages. In this regard, AFEs 411 in each of remote DSL modems 415 perform both transmit and receive interface functions. In turn, AFEs 411 in each of remote modems 415 bidirectionally interface with line driver 417, which is a high-speed line driver and receiver for driving and receiving the ADSL signals on twisted pair facility TWP, such as the THS6002 line driver available from Texas Instruments Incorporated. Line drivers 417 in remote modems 415 are connected to a four-wire to two-wire "hybrid" integrated circuit 419, which converts the dedicated transmit and receive lines from line driver 417 to the two-wire arrangement of twisted pair facility TWP, in full-duplex fashion.

In the central office, DSL modem 408 includes host interface 409, which connects modem 408 to a host computer (not shown). Host interface 409 may, as noted above, be implemented by conventional circuitry such as the TNETD2100 digital serial bus interface circuit available from Texas Instruments Incorporated. As noted above, the host computer will interface central office modem 408 to a splitter for separating POTS from the data traffic, as noted above, and thus to the conventional telephone network (PSTN) and wide-area network (WAN) as appropriate for the service being provided. Central office modem 408 includes digital DSL transceiver function 410, which connects to multiple analog front end functions (AFEs) 412 as shown in FIG. 8. As in the case of remote DSL modems 415, AFEs 412 provide all loop interface components necessary for DSL communications other than those which involve high voltages, for both transmit and receive interface functions.

Digital transceiver function 410 is similarly constructed as and performs similar processing to digital transceiver functions 413 in remote DSL modems 415, with certain differences in function arising from the different frequencies of its received and transmitted traffic. As before, digital transceiver function 410 is preferably implemented as a high-performance digital signal processor, such as DSP 130 described hereinabove, so that Reed-Solomon decoding may be efficiently carried out thereby. As in the case of remote DSL modems 415, such DSP implementation includes the provision of a combined Chien search and error position unit, so that these functions are carried out in an efficient manner as described above relative to the preferred embodiments of the invention, under the control of instructions in the instruction set of DSP 130. The Reed-Solomon decoding operation carried out by digital transceiver function 410, implemented as DSP 130 according to the preferred embodiment of the invention, is applied to encoded signals that are communicated over its associated twisted pair facility TWP from remote modem 415, after processing via hybrid 416, line driver 414, and AFE 412. Following the Reed-Solomon decoding operation carried out by way of digital transceiver function 410, implemented as DSP 130 according to the preferred embodiment of the invention, the decoded digital signals are then communicated to the central office host computer via interface 409.

The advantages of the present invention as obtained in the DSL modem application are also, as noted above, useful in many other applications in which Reed-Solomon or similar decoding is required. The DSL modem implementation shown in FIG. 8 and described hereinabove is provided by way of example only. Examples of such other implementations include cable modems, set-top boxes for the receipt and decoding of digital video, disk drive communications within computers, other types of network communications among computer workstations, and the like.

The present invention has been observed to greatly improve the efficiency with which Reed-Solomon decoding may be implemented in programmable logic devices such as DSPs or microprocessors, and executed in response to higher level language code (e.g., C, C++) or as processor-specific assembly language code. In particular, it is contemplated that the present invention will greatly facilitate the realization of Chien search and error position functions into such programmable logic devices, permitting these functions to be rapidly performed in response to a processor instruction, and thus efficiently carried out in real time processing by devices of relatively modest complexity. It is therefore contemplated that the present invention will be beneficial in many applications, and will assist in improving the capability of Reed-Solomon error correction while still maintaining the decoding process as a real-time operation.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A circuit for generating error position indicators in Reed-Solomon decoding, comprising:

a root detection circuit, for sequentially evaluating an error locator polynomial corresponding to a plurality of data words corresponding to error locator polynomial coefficients, for each of a plurality of elements in a finite field, and for generating a zero signal responsive to identifying a root of the error locator polynomial;

an error position register comprising a plurality of stages, each of the error position register stages having a data input and having a control input;

a decoder, coupled to the root detection circuit and to the error position register, for sequentially enabling the plurality of error position register stages responsive to the root detection circuit generating the zero signal;

an index counter for generating a count corresponding to the member of a finite field for which the root detection circuit is evaluating the error locator polynomial; and a subtractor for subtracting the count from a constant corresponding to the number of members of the finite field, the subtractor having an output coupled to the data input of each of the plurality of register stages of the error position register stages.

2. The circuit of claim 1, further comprising:

a zero detection circuit coupled to the index counter, for generating a zero select signal responsive to the count equaling zero; and a multiplexer, having a first input coupled to the output of the subtractor and having a second input presenting a zero value, and having an output coupled to the data input of each of the plurality of error position register stages, the multiplexer also having a control input coupled to receive the zero select signal from the zero detection circuit so that, responsive to the zero select signal, the multiplexer forwards the zero value to the data inputs of the plurality of error position register stages.

3. The circuit of claim 2, wherein the index counter presents the count on a plurality of signal lines;

wherein the subtractor comprises:

a plurality of inverters, each coupled to one of the plurality of signal lines; and wherein the multiplexer comprises:

a plurality of two-bit multiplexers, each having an input coupled to the output of a corresponding one of the plurality of inverters and having an input coupled to a zero logic level.

4. The circuit of claim 1, further comprising:

a zeroes register comprising a plurality of stages, each of the zeroes register stages having a data input, and having a control input coupled to the decoder, so that the zeroes register stages are also sequentially enabled responsive to the root detection circuit generating the zero signal; and a finite field exponentiation circuit, having an input coupled to the index counter for receiving the count therefrom, and having an output coupled to the data input of the plurality of zeroes register stages.

5. The circuit of claim 1, wherein the finite field corresponds to a Galois field.

6. The circuit of claim 1, wherein the root detection circuit comprises:

a plurality of weighted sum blocks, each for presenting a finite field product of one of the plurality of error locator polynomial coefficients and one of the plurality of finite field elements;

a finite field adder, for performing a finite field addition of the finite field products to produce an evaluation value; and a zero detection circuit, coupled to the finite field adder, for generating the zero signal responsive to the evaluation value equaling zero.

7. The circuit of claim 6, wherein a lowest order error locator polynomial coefficient is applied directly to the finite field adder.

8. A programmable logic device, comprising:

control circuitry, for receiving program instructions and for generating control signals responsive thereto;

a data bus; and a combined Chien search and error position execution unit coupled to the data bus, for executing a Chien search and error position instruction under the control of the control circuitry, and comprising:

a root detection circuit, for sequentially evaluating an error locator polynomial corresponding to a plurality of data words corresponding to error locator polynomial coefficients, for each of a plurality of elements in a finite field, and for generating a zero signal responsive to identifying a root of the error locator polynomial;

an error position register comprising a plurality of stages, each of the error position register stages having a data input and having a control input;

a decoder, coupled to the root detection circuit and to the error position register, for sequentially enabling the plurality of error position register stages responsive to the root detection circuit generating the zero signal;

an index counter for generating a count corresponding to the member of a finite field for which the root detection circuit is evaluating the error locator polynomial; and a subtractor for subtracting the count from a constant corresponding to the number of members of the finite field, the subtractor having an output coupled to the data input of each of the plurality of register stages of the error position register stages.

9. The programmable logic device of claim 8, wherein the combined Chien search and error position execution unit further comprises:

a zero detection circuit coupled to the index counter, for generating a zero select signal responsive to the count equaling zero; and a multiplexer, having a first input coupled to the output of the subtractor and having a second input presenting a zero value, and having an output coupled to the data input of each of the plurality of error position register stages, the multiplexer also having a control input coupled to receive the zero select signal from the zero detection circuit so that, responsive to the zero select signal, the multiplexer forwards the zero value to the data inputs of the plurality of error position register stages.

10. The programmable logic device of claim 9, wherein the index counter presents the count on a plurality of signal lines;

wherein the subtractor comprises:
a plurality of inverters, each coupled to one of the plurality of signal lines; and wherein the multiplexer comprises:
a plurality of two-bit multiplexers, each having an input coupled to the output of a corresponding one of the plurality of inverters and having an input coupled to a zero logic level.

11. The programmable logic device of claim 8, wherein the combined Chien search and error position execution unit further comprises:

a zeroes register comprising a plurality of stages, each of the zeroes register stages having a data input, and having a control input coupled to the decoder, so that the zeroes register stages are also sequentially enabled responsive to the root detection circuit generating the zero signal; and a finite field exponentiation circuit, having an input coupled to the index counter for receiving the count therefrom, and having an output coupled to the data input of the plurality of zeroes register stages.

12. The programmable logic device of claim 8, wherein the finite field corresponds to a Galois field.

13. The programmable logic device of claim 8, wherein the root detection circuit comprises:

a plurality of weighted sum blocks, each for presenting a finite field product of one of the plurality of error locator polynomial coefficients and one of the plurality of finite field elements;

a finite field adder, for performing a finite field addition of the finite field products to produce an evaluation value; and a zero detection circuit, coupled to the finite field adder, for generating the zero signal responsive to the evaluation value equaling zero.

14. The programmable logic device of claim 8, further comprising:

a multiply/add unit, for executing multiply-and-add program instructions under the control of the control circuitry.

15. A method of operating a logic circuit to generate error position indicator terms in Reed-Solomon decoding, comprising the steps of:

evaluating an error locator polynomial for each of a plurality of members of a finite field;

during the evaluating step, maintaining a count value corresponding to the one of the plurality of members for which the evaluating step is being performed;

subtracting the count value from a maximum value corresponding to the number of members of the finite field to produce a position value; and responsive to the evaluating step identifying a root of the error locator polynomial, storing the position value into a selected one of a plurality of error position register stages.

16. The method of claim 15, further comprising:

issuing a zero signal responsive to the evaluating step identifying a root of the error locator polynomial;

wherein the storing step comprises:
updating the contents of a root counter to correspond to the number of identified roots;
applying the position value to a data input of each of the plurality of error position register stages; and
responsive to the zero signal, enabling an error position register stage corresponding to contents of the root counter to store the position value.

17. The method of claim 16, further comprising:

performing a finite field exponentiation of the count value to produce a zeroes value;

applying the zeroes value to a data input of each of a plurality of zeroes register stages; and responsive to the zero signal, enabling a zeroes register stage corresponding to contents of the root counter to store the zeroes value.

18. The method of claim 15, further comprising:

performing a finite field exponentiation of the count value to produce a zeroes value;

responsive to the evaluating step identifying a root of the error locator polynomial, storing the zeroes value into a selected one of a plurality of zeroes register stages.

* * * * *